United States Patent
Liu et al.

(10) Patent No.: US 9,906,022 B2
(45) Date of Patent: Feb. 27, 2018

(54) CASCADED MULTILEVEL CONVERTER SELF-TEST SYSTEM AND SELF-TEST METHOD FOR THE SAME

(71) Applicant: Sungrow Power Supply Co., Ltd., Hefei, Anhui (CN)

(72) Inventors: Baoqi Liu, Anhui (CN); Yongli Xiao, Anhui (CN); Liying Xue, Anhui (CN); Zhihuai Zeng, Anhui (CN)

(73) Assignee: SUNGROW POWER SUPPLY CO., LTD., Hefei, Anhui (CN)

( * ) Notice: Subject to any disclaimer, the term of this patent is extended or adjusted under 35 U.S.C. 154(b) by 113 days.

(21) Appl. No.: 15/198,544

(22) Filed: Jun. 30, 2016

(65) Prior Publication Data

US 2017/0141569 A1  May 18, 2017

(30) Foreign Application Priority Data

Nov. 18, 2015 (CN) .......................... 2015 1 0795383

(51) Int. Cl.
*H02J 1/00* (2006.01)
*H02J 3/00* (2006.01)
(Continued)

(52) U.S. Cl.
CPC ................ *H02J 1/00* (2013.01); *G01R 27/18* (2013.01); *G01R 31/02* (2013.01); *G01R 31/14* (2013.01);
(Continued)

(58) Field of Classification Search
CPC .......... H02J 1/00; G01R 27/18; G01R 31/02; G01R 31/14; H02M 3/158; H02M 7/49; H02M 1/32; H02S 50/00
(Continued)

(56) References Cited

U.S. PATENT DOCUMENTS

2001/0040453 A1   11/2001   Toyomura et al.
2009/0146667 A1   6/2009   Adest et al.
(Continued)

FOREIGN PATENT DOCUMENTS

CN   102798760 A   11/2012
CN   103941073 A   7/2014
(Continued)

OTHER PUBLICATIONS

European Search Report corresponding to Application No. 16177284.3-1804; dated Apr. 3, 2017.
(Continued)

*Primary Examiner* — Carlos Amaya
(74) *Attorney, Agent, or Firm* — Cantor Colburn LLP

(57) ABSTRACT

A cascaded multilevel converter self-test system and a self-test method for the cascaded multilevel converter self-test system are provided. The self-test system includes a cascaded multilevel converter and a self-test device. The cascaded multilevel converter includes at least two converting circuits which are cascaded. The self-test device includes at least one current detecting circuit, a voltage acquiring module and a calculating module. The current detecting circuit is configured to detect a first detected current and a second detected current. The voltage acquiring module is configured to acquire first bus voltages and second bus voltages. The calculating module is configured to calculate an insulation resistance value of the cascaded multilevel converter based on the first detected current, the second detected current, the first bus voltages and the second bus voltages.

10 Claims, 7 Drawing Sheets

(51) Int. Cl.
*H02M 3/158* (2006.01)
*G01R 27/18* (2006.01)
*G01R 31/02* (2006.01)
*G01R 31/14* (2006.01)
*H02M 7/49* (2007.01)
*H02M 1/32* (2007.01)

(52) U.S. Cl.
CPC ............ *H02M 3/158* (2013.01); *H02M 7/49* (2013.01); *H02M 1/32* (2013.01)

(58) Field of Classification Search
USPC .......................................................... 307/82
See application file for complete search history.

(56) References Cited

U.S. PATENT DOCUMENTS

| | | |
|---|---|---|
| 2012/0223734 A1 | 9/2012 | Takada et al. |
| 2015/0084654 A1 | 3/2015 | Mueller |
| 2016/0380589 A1* | 12/2016 | Morita ................. H02H 3/16 324/509 |

FOREIGN PATENT DOCUMENTS

| | | |
|---|---|---|
| CN | 204116537 | 1/2015 |
| WO | 2011017802 A1 | 2/2011 |
| WO | 2015033627 A1 | 3/2015 |

OTHER PUBLICATIONS

Australian Office Action corresponding to Application. No. 2016204594; dated Feb. 27, 2017.

* cited by examiner

CASCADED MULTILEVEL CONVERTER SELF-TEST SYSTEM AND SELF-TEST METHOD FOR THE SAME

CROSS REFERENCE OF RELATED APPLICATION

The present application claims the priority to Chinese Patent Application No. 201510795383.0, titled "CASCADED MULTILEVEL CONVERTER SELF-TEST SYSTEM AND SELF-TEST METHOD FOR THE SAME", filed on Nov. 18, 2015 with the State Intellectual Property Office of the PRC, which is incorporated herein by reference in its entirety.

FIELD

The present disclosure relates to the technical field of cascaded multilevel converter, and in particular to a cascaded multilevel converter self-test system and a self-test method for the cascaded multilevel converter self-test system.

BACKGROUND

Cascaded multilevel converters (CMC) are widely used in electrical energy conversion, high voltage frequency conversion drive, high-voltage direct current transmission, reactive power compensation and other applications. Normally, a cascaded multilevel converter includes a single-phase switch bridge or half-bridge inverter circuits which are connected in series. An integrate insulation resistance of the cascaded multilevel converter should be large enough to avoid a safety risk caused by an overlarge leakage current due to a small integrate insulation resistance during the use of the cascaded multilevel converter.

In practice, leakage protection and insulation resistance detection need to be performed on the cascaded multilevel converter by a dedicated circuit. This need is especially prominent for a photovoltaic power generating system. For example, it is required in a safety regulation that a cascaded multilevel converter should not be started until its insulation resistance reaches a certain level. At present, a conventional insulation resistance detection solution is only adaptive for calculating an insulation resistance value of a single converting circuit or a single inverter, and cannot be used to measure and calculate an insulation resistance value of a cascaded multilevel converter.

SUMMARY

In order to address the above issue in the conventional technology, an object of the present disclosure is to provide a cascaded multilevel converter self-test system and a self-test method for the cascaded multilevel converter self-test system to measure and calculate an integrate insulation resistance value of a cascaded multilevel converter.

In order to achieve the above object, a technical solution is provided as follows according to the present disclosure.

A cascaded multilevel converter self-test system includes a cascaded multilevel converter and a self-test device, where the cascaded multilevel converter includes at least two converting circuits which are cascaded, and the self-test device includes at least one current detecting circuit, a voltage acquiring module and a calculating module;

the at least two converting circuits each have a first output terminal and a second output terminal and are electrically connected in sequence with the first output terminal and the second output terminal, and each of the at least two converting circuits is provided with and electrically connected to an external direct current source in a one-to-one manner, the direct current source is configured to supply a direct current to the converting circuit corresponding to the direct current source;

a first terminal of the at least one current detecting circuit is electrically connected to the first output terminal of the first one of the at least two converting circuits and/or the second output terminal of the last one of the at least two converting circuits, a second terminal of the at least one current detecting circuit is grounded; the at least one current detecting circuit is configured to detect a first detected current in a case that the cascaded multilevel converter is in a first conducting state and a second detected current in a case that the cascaded multilevel converter is in a second conducting state;

the voltage acquiring module is configured to acquire first bus voltages of the at least two converting circuits in a case that the cascaded multilevel converter is in the first conducting state and second bus voltages of the at least two converting circuits in a case that the cascaded multilevel converter is in the second conducting state; and the calculating module is configured to calculate an insulation resistance value of the cascaded multilevel converter based on the first detected current, the second detected current, the first bus voltages of the at least two converting circuits and the second bus voltages of the at least two converting circuits.

Furthermore, the cascaded multilevel converter self-test system may further includes:

a comparing module configured to compare the insulation resistance value of the cascaded multilevel converter calculated by the calculating module with a reference insulation resistance value to determine whether the insulation resistance value of the cascaded multilevel converter reaches the reference insulation resistance value.

Furthermore, each of the at least two converting circuits may include a first capacitor, a first switch transistor, a second switch transistor, a third switch transistor and a fourth switch transistor;

a first terminal of the first switch transistor may be electrically connected to a first terminal of the second switch transistor, a first terminal of the first capacitor and a positive electrode of the direct current source corresponding to the converting circuit, a second terminal of the first switch transistor may be electrically connected to a first terminal of the third switch transistor, a second terminal of the second switch transistor may be electrically connected to a first terminal of the fourth switch transistor, and a second terminal of the third switch transistor may be electrically connected to a second terminal of the fourth switch transistor, a second terminal of the first capacitor and a negative electrode of the direct current source corresponding to the converting circuit;

the self-test device may further include a control module configured to control the first switch transistor, the second switch transistor, the third switch transistor and the fourth switch transistor to be switched on or switched off;

the cascaded multilevel converter may be in the first conducting state in a case that the first switch transistor and the second switch transistor are switched on and the third switch transistor and the fourth switch transistor are switched off; and the cascaded multilevel converter may be in the second conducting state in a case that the third switch transistor and the fourth switch transistor are switched on and the first switch transistor and the second switch transistor are switched off.

Furthermore, the cascaded multilevel converter may further include a filtering circuit and a switch group module; and a first terminal of the filtering circuit may be electrically connected to the first output terminal of the first one of the at least two converting circuits, a second terminal of the filtering circuit may be electrically connected to the second output terminal of the last one of the at least two converting circuits, and a third terminal and a fourth terminal of the filtering circuit may be electrically connected to the switch group module.

Furthermore, the switch group module may include a first switch, a second switch, a third switch and a fourth switch;

a second terminal of the first switch may be electrically connected to a first terminal of the second switch, and a first terminal of the first switch may be electrically connected to the third terminal of the filtering circuit; and a second terminal of the third switch may be electrically connected to a first terminal of the fourth switch, and a first terminal of the third switch may be electrically connected to the fourth terminal of the filtering circuit.

Furthermore, each of the first switch, the second switch, the third switch and the fourth switch may be a relay.

Furthermore, the current detecting circuit may include a first resistor, a fifth switch and a current acquiring unit connected in series.

Furthermore, the first terminal of the current detecting circuit may be electrically connected to the first output terminal of the first one of the at least two converting circuits, or the first terminal of the current detecting circuit may be electrically connected to the second output terminal of the last one of the at least two converting circuits, or the first terminal of the current detecting circuit may be electrically connected to a third terminal or a fourth terminal of a filtering circuit in a case that the cascaded multilevel converter includes the filtering circuit; and the second terminal of the current detecting circuit may be electrically connected to a ground wire.

Positions of the first resistor, the fifth switch and the current acquiring unit in the current detecting circuit may be exchanged arbitrarily.

A self-test method for the cascaded multilevel converter self-test system is further provided according to the present disclosure. The self-test method includes:

detecting, by the current detecting circuit, the first detected current in a case that the cascaded multilevel converter is in the first conducting state and the second detected current in a case that the cascaded multilevel converter is in the second conducting state;

acquiring, by the voltage acquiring module, the first bus voltages of the at least two converting circuits in a case that the cascaded multilevel converter is in the first conducting state and the second bus voltages of the at least two converting circuits in a case that the cascaded multilevel converter is in the second conducting state; and calculating, by the calculating module, the insulation resistance value of the cascaded multilevel converter based on the first detected current, the second detected current, the first bus voltages of the at least two converting circuits and the second bus voltages of the at least two converting circuits.

Furthermore, the self-test method may further includes:

comparing, by a comparing module, the insulation resistance value of the cascaded multilevel converter calculated by the calculating module with a reference insulation resistance value to determine whether the insulation resistance value of the cascaded multilevel converter reaches the reference insulation resistance value.

In the cascaded multilevel converter self-test system and the self-test method according to the present disclosure, the self-test device is provided for the cascaded multilevel converter. The self-test device includes a current detecting circuit, a voltage acquiring module and a calculating module. The current detecting circuit is configured to detect the first detected current in a case that the cascaded multilevel converter is in the first conducting state and the second detected current in a case that the cascaded multilevel converter is in the second conducting state. The voltage acquiring module is configured to acquire the first bus voltages of the at least two converting circuits in a case that the cascaded multilevel converter is in the first conducting state and the second bus voltages of the at least two converting circuits in a case that the cascaded multilevel converter is in the second conducting state. The calculating module is configured to calculate the insulation resistance value of the cascaded multilevel converter based on the above parameters. With the present disclosure, it is solved a problem in the conventional technology that only the insulation resistance value of a signal converting circuit in the cascaded multilevel converter can be calculated while the integrate insulation resistance value of the cascaded multilevel converter cannot be calculated and measured, thereby avoiding a safety risk caused by an overlarge leakage current due to a small integrate insulation resistance.

BRIEF DESCRIPTION OF THE DRAWINGS

In order to describe technical solutions of exemplary embodiments of the present disclosure more clearly, drawings for the embodiments of the present disclosure are introduced simply as follows. It is apparent that the described drawings are only the drawings for a part of the embodiments according to the present disclosure. Other drawings may be obtained by those skilled in the art based on the drawings in the present disclosure without any creative work.

DETAILED DESCRIPTION OF EMBODIMENTS

In order to make the object, technical solution and advantages of the present disclosure more clear, the technical solution is described completely as follows with embodiments in conjunction with the accompanying drawings for the embodiments of the present disclosure. It is apparent that the described embodiments are only a part of the embodiments of the present disclosure. All the other embodiments obtained by those skilled in the art based on the embodiments of the present disclosure without any creative work fall into the scope of the present disclosure.

First Embodiment

Figure 1:
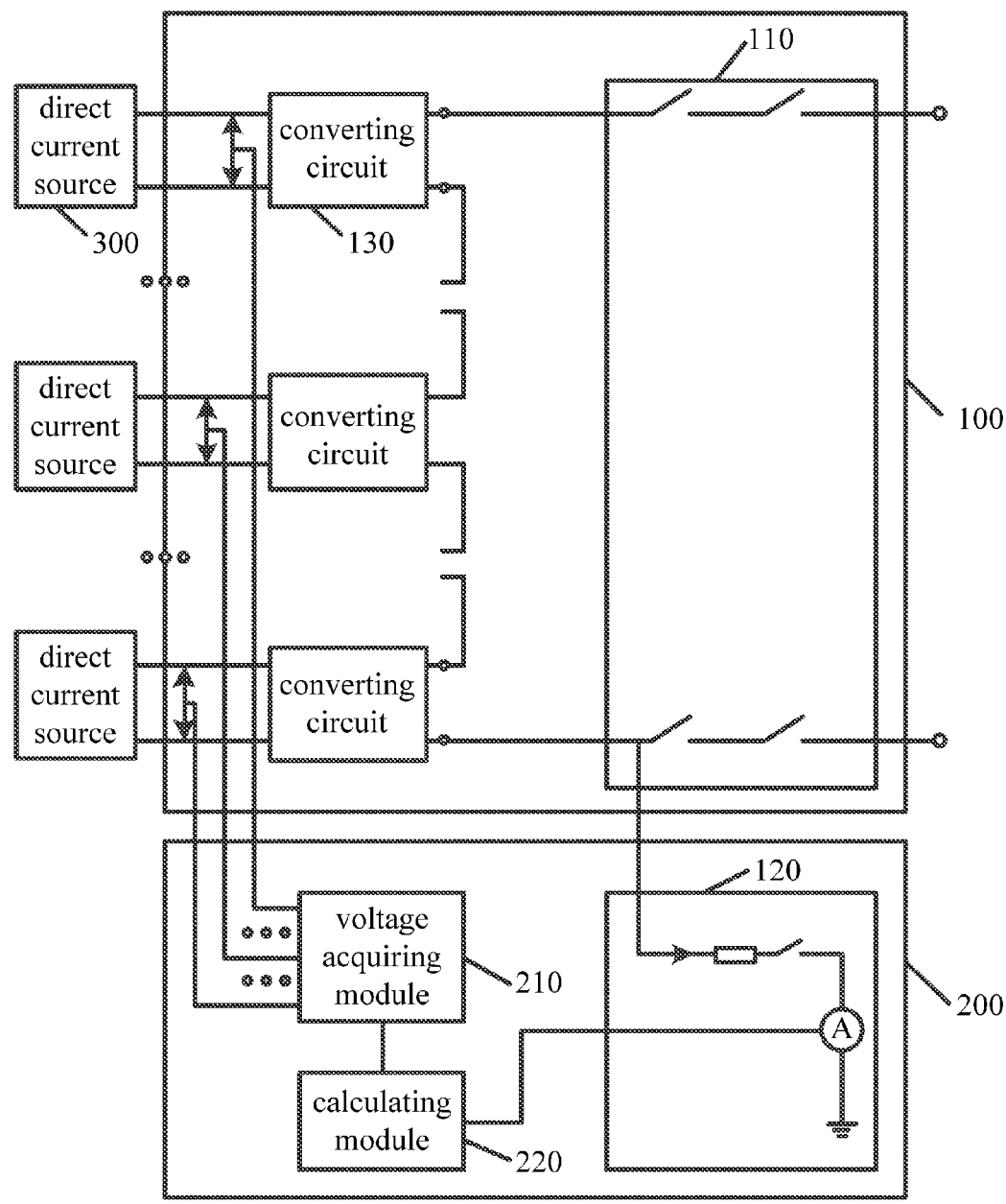
FIG. 1 is a first schematic structural diagram of a cascaded multilevel converter self-test system according to a first embodiment of the present disclosure.

FIG. 1 is a first schematic structural diagram of a cascaded multilevel converter self-test system according to a first embodiment of the present disclosure. As shown in FIG. 1, a cascaded multilevel converter self-test system according to the first embodiment of the present disclosure includes a cascaded multilevel converter 100 and a self-test device 200. The cascaded multilevel converter 100 includes at least two converting circuits 130 which are cascaded. The self-test device 200 includes at least one current detecting circuit 120, a voltage acquiring module 210 and a calculating module 220.

A built-in output filtering circuit may be or may not be provided to the at least two converting circuits 130. In a case that a built-in output filtering circuit is provided to each of the converting circuits 130, an external filtering circuit may not be provided. Otherwise, it is preferred to provide an external filtering circuit. Furthermore, the converting circuits 130 each have a first output terminal and a second output terminal and are electrically connected in sequence with the first output terminal and the second output terminal. Each of the at least two converting circuits 130 is provided with and electrically connected to an external direct current source 300 in a one-to-one manner, the direct current source 300 is configured to supply a direct current to the converting circuit 130 corresponding to the direct current source 300. Note that the term "direct current source" used throughout the present disclosure refers to a DC (direct current) current source and/or a DC (direct current) voltage source. Referring to FIG. 1, a positive electrode and a negative electrode of the direct current source 300 are electrically connected to a first input terminal and a second input terminal of the converting circuit 130, respectively.

A first terminal of the current detecting circuit 120 is electrically connected to the first output terminal of the first one of the at least two converting circuits 130 or the second output terminal of the last one of the at least two converting circuits 130. A second terminal of the current detecting circuit 120 is grounded. The current detecting circuit 120 is configured to detect a first detected current in a case that the cascaded multilevel converter 100 is in a first conducting state and a second detected current in a case that the cascaded multilevel converter is in a second conducting state. In the embodiment as shown in FIG. 1, the current detecting circuit 120 is electrically connected to the second output terminal of the last one of the at least two converting circuits 130.

The voltage acquiring module 210 is configured to acquire first bus voltages of the at least two converting circuits 130 in a case that the cascaded multilevel converter 100 is in the first conducting state and second bus voltages of the at least two converting circuits 130 in a case that the cascaded multilevel converter 100 is in the second conducting state.

The first bus voltages each refer to a potential difference between the first input terminal and the second input terminal of a respective converting circuit, i.e., a potential difference between the positive electrode and the negative electrode of the direct current source 300 in a case that the cascaded multilevel converter 100 is in the first conducting state, and the second bus voltages each refer to such potential difference in a case that the cascaded multilevel converter 100 is in the second conducting state.

The calculating module 220 is configured to calculate an insulation resistance value of the cascaded multilevel converter based on the first detected current, the second detected current, the first bus voltages of the at least two converting circuits 130 and the second bus voltages of the at least two converting circuits 130.

In the first embodiment of the present disclosure, the self-test device is provided for the cascaded multilevel converter. The self-test device includes a current detecting circuit, a voltage acquiring module and a calculating module. The current detecting circuit is configured to detect the first detected current in a case that the cascaded multilevel converter is in the first conducting state and the second detected current in a case that the cascaded multilevel converter is in the second conducting state. The voltage acquiring module is configured to acquire the first bus voltages of the at least two converting circuits in a case that the cascaded multilevel converter is in the first conducting state and the second bus voltages of the at least two converting circuits in a case that the cascaded multilevel converter is in the second conducting state. The calculating module is configured to calculate the insulation resistance value of the cascaded multilevel converter based on the above parameters. With the present disclosure, it is solved a problem in the conventional technology that only the insulation resistance value of a signal converting circuit in the cascaded multilevel converter can be calculated while the integrate insulation resistance value of the cascaded multilevel converter cannot be calculated and measured, thereby avoiding a safety risk caused by an overlarge leakage current due to a small integrate insulation resistance.

Figure 2:
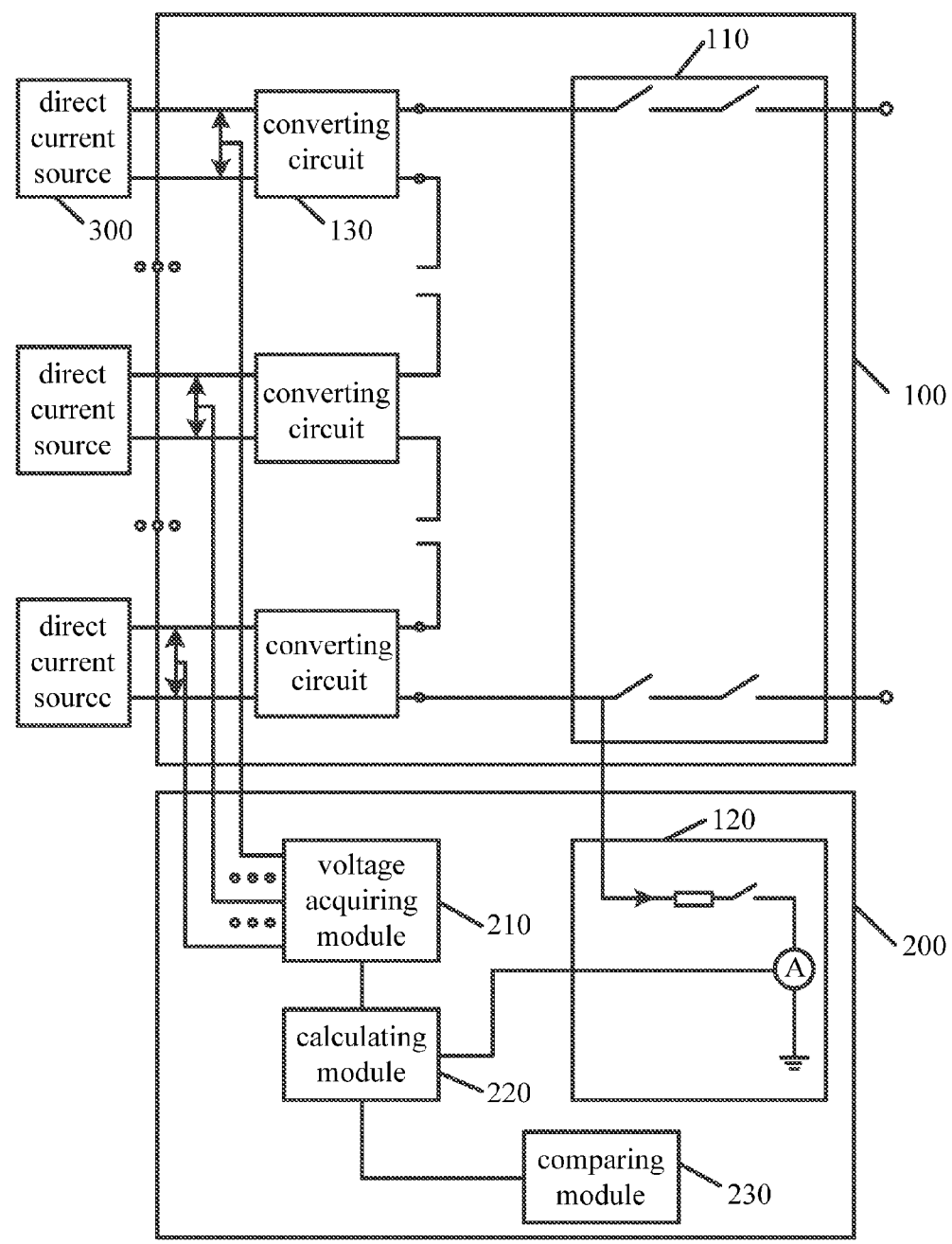
FIG. 2 is a second schematic structural diagram of a cascaded multilevel converter self-test system according to the first embodiment of the present disclosure.

Furthermore, FIG. 2 is a second schematic structural diagram of a cascaded multilevel converter self-test system according to the first embodiment of the present disclosure. As shown in FIG. 2, the self-test device 200 further includes a comparing module 230 on the basis of the structure shown in FIG. 1. The comparing module 230 is configured to compare the insulation resistance value of the cascaded multilevel converter calculated by the calculating module 220 with a reference insulation resistance value to determine whether the insulation resistance value of the cascaded multilevel converter reaches the reference insulation resistance value.

Second Embodiment

Figure 3:
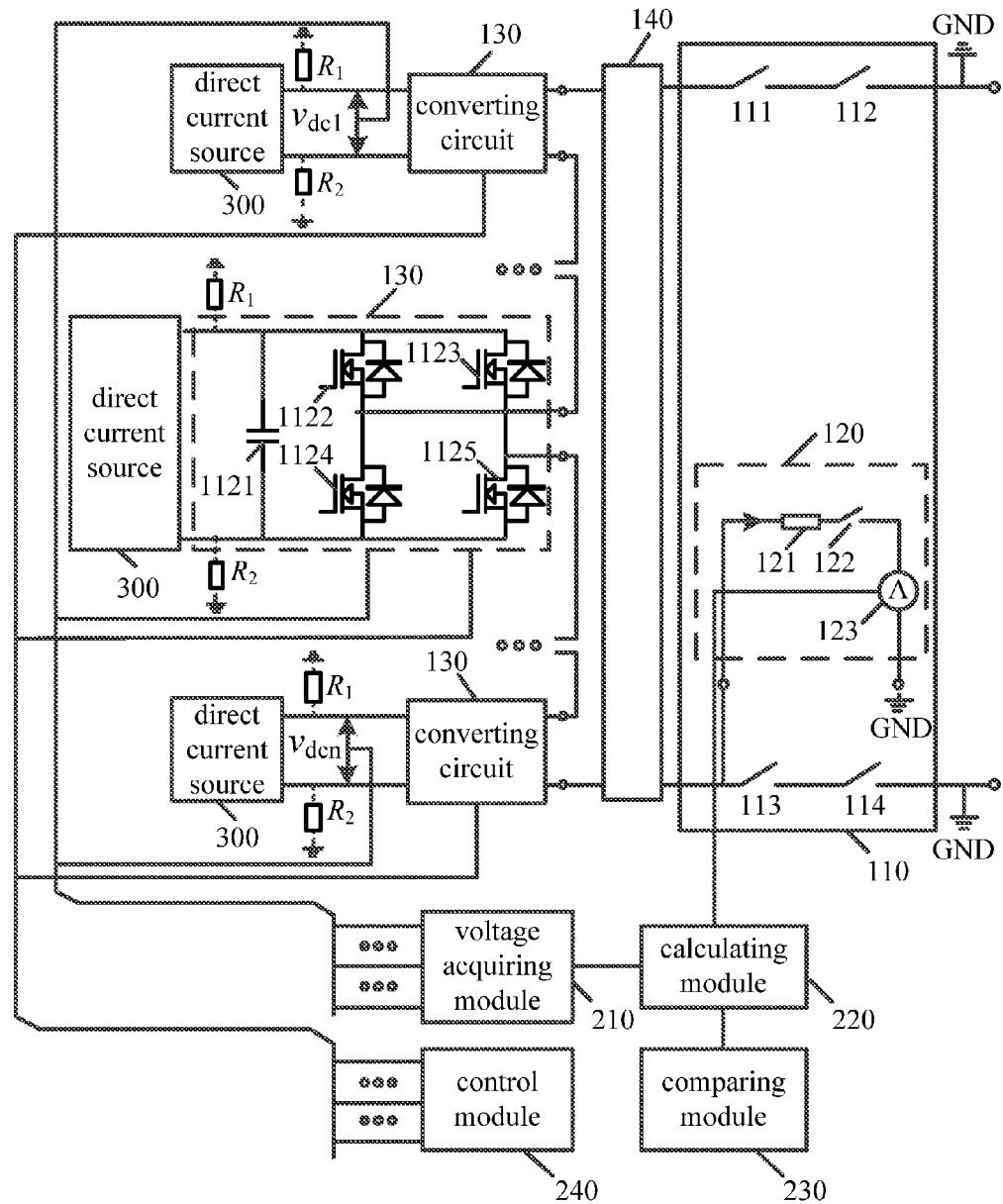
FIG. 3 is a schematic circuit diagram of a cascaded multilevel converter self-test system according to a second embodiment of the present disclosure.

FIG. 3 is a schematic circuit diagram of a cascaded multilevel converter self-test system according to a second embodiment of the present disclosure. As shown in FIG. 3, each of the at least two converting circuits 130 in the system includes a first capacitor 1121, a first switch transistor 1122, a second switch transistor 1123, a third switch transistor 1124 and a fourth switch transistor 1125.

A first terminal of the first switch transistor 1122 is electrically connected to a first terminal of the second switch transistor 1123, a first terminal of the first capacitor 1121 and a positive electrode of the direct current source 300 corresponding to the converting circuit 130. A second terminal of the first switch transistor 1122 is electrically connected to a first terminal of the third switch transistor 1124 and serves as the first output terminal of the converting circuit 130. A second terminal of the second switch transistor 1123 is electrically connected to a first terminal of the fourth switch transistor 1125 and serves as the second output terminal of the converting circuit 130. A second terminal of the third switch transistor 1124 is electrically connected to a second terminal of the fourth switch transistor 1125, a second terminal of the first capacitor 1121 and a negative electrode of the direct current source 300 corresponding to the converting circuit 130.

The above converting circuits 130 are configured to convert the direct current supplied by the direct current source 300 into an alternating current.

Furthermore, the self-test device 200 further includes a control module 240. The control module 240 is electrically connected to each of the converting circuit 130 and is configured to control the first switch transistor 1122, the second switch transistor 1123, the third switch transistor 1124 and the fourth switch transistor 1125 in each of the converting circuits 130 to be switched on or switched off. The cascaded multilevel converter 100 is in the first conducting state in a case that the first switch transistor 1122 and the second switch transistor 1123 are switched on and the third switch transistor 1124 and the fourth switch transistor 1125 are switched off. The cascaded multilevel converter 100 is in the second conducting state in a case that the third switch transistor 1124 and the fourth switch transistor 1125 are switched on and the first switch transistor 1122 and the second switch transistor 1123 are switched off.

It should be noted that, in the second embodiment of the present disclosure, the first switch transistor 1122, the second switch transistor 1123, the third switch transistor 1124 and the fourth transistor 1125 may have a same structure. For example, each of the switch transistors may include a field effect transistor and a diode connected with each other, where a drain electrode of the field effect transistor is connected to a negative electrode of the diode, and a source electrode of the field effect transistor is connected to a positive electrode of the diode. The switch transistors may also in other structures of switch.

Furthermore, as shown in FIG. 3, in a case that the direct current source 300 is a power supply having a positive electrode and a negative electrode not directly grounded (which depends on a form of the converter circuit), such as a photovoltaic cell, an equivalent resistor R1 exists between the ground and the positive electrode of the power supply, and an equivalent resistor R2 exists between the ground and the negative electrode of the power supply.

Furthermore, as shown in FIG. 3, the cascaded multilevel converter 100 further includes a filtering circuit 140 and a switch group module 110. The filtering circuit 140 is preferably added for the cascaded multilevel converter particularly in a case that no built-in filtering circuit is provided to the converting circuits 130.

A first terminal of the filtering circuit 140 is electrically connected to the first output terminal of the first one of the at least two converting circuits 130. A second terminal of the filtering circuit 140 is electrically connected to the second output terminal of the last one of the at least two converting circuits 130. A third terminal and a fourth terminal of the filtering circuit 140 are electrically connected to the switch group module 110. The filtering circuit 140 may be an L-filter, an LC-filter or an LCL-filter or other filters. The filtering circuit 140 is configured to filter an alternating current outputted from the cascaded multilevel converter 100 to filter out ripple components.

In the embodiment as shown in FIG. 3, the switch group module 110 includes a first switch 111, a second switch 112, a third switch 113 and a fourth switch 114.

As shown in FIG. 3, a second terminal of the first switch 111 is electrically connected to a first terminal of the second switch 112, and a first terminal of the first switch 111 is electrically connected to the third terminal of the filtering circuit 140. A second terminal of the third switch 113 is electrically connected to a first terminal of the fourth switch 114, and a first terminal of the third switch 113 is electrically connected to the fourth terminal of the filtering circuit 140.

It should be noted that the switch group module 110 functions as switches only when the cascaded multilevel converter 100 is in an operation state. During a self-test performed by the self-test system, each of the switches in the switch group module 110 is always switched off. Preferably, in the second embodiment of the present disclosure, each of the first switch 111, the second switch 112, the third switch 113 and the fourth switch 114 is a relay.

Furthermore, in the second embodiment of the present disclosure, the current detecting circuit 120 includes a first resistor 121, a fifth switch 122 and a current acquiring unit 123. The current acquiring unit 123 is configured to detect a current. In a case that the filtering circuit 140 is not provided separately in the cascaded multilevel converter, a first terminal of the current detecting circuit 120 may be electrically connected to the first output terminal of the first one of the at least two converting circuits 130, or may be electrically connected to the second output terminal of the last one of the at least two converting circuits 130. Alternatively, in a case that the filtering circuit 140 is provided separately in the cascaded multilevel converter, the first terminal of the current detecting circuit 120 may be electrically connected to a third terminal or a fourth terminal of the filtering circuit 140. A second terminal of the current detecting circuit 120 is electrically connected to a ground wire. Furthermore, positions of the first resistor 121, the fifth switch 122 and the current acquiring unit 123 in the current detecting circuit 120 may be exchanged arbitrarily.

In the embodiment as shown in FIG. 3, a first terminal of the first resistor 121 in the current detecting circuit 120 is electrically connected to the fourth terminal of the filtering circuit 140, and a second terminal of the first resistor 121 is electrically connected to a first terminal of the fifth switch 122. A second terminal of the fifth switch 122 is electrically connected to a first terminal of the current acquiring unit 123. A second terminal of the current acquiring unit 123 is electrically connected to a ground wire. The current acquiring unit 123 is capable of detecting a current in a case that the cascaded multilevel converter 100 is in the first conducting state and a current in a case that the cascaded multilevel converter 100 is in the second conducting state.

Figure 4:
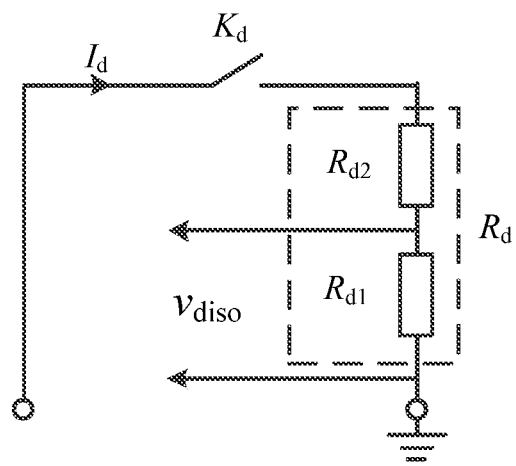
FIG. 4 is a schematic circuit diagram of a voltage dividing circuit according to the second embodiment of the present disclosure.

The above current acquiring unit 123 may detect a magnitude of a current by using a Hall current transducer, a current transformer, or a voltage dividing circuit. FIG. 4 is a schematic circuit diagram of a voltage dividing circuit according to the second embodiment of the present disclosure. Referring to FIG. 4, the voltage dividing circuit includes a switch $K_d$ and a sampling resistor $R_d$ which are connected in series. The sampling resistor $R_d$ may include a resistor $R_{d1}$ and a resistor $R_{d2}$ which are connected in series.

Positions of the switch $K_d$, the resistor $R_{d1}$ and the resistor $R_{d2}$ connected in series in the circuit may be exchanged. A magnitude of a sampled current $I_d$ may be calculated by detecting a voltage $v_{diso}$ across the resistor $R_{d1}$. In this case, $R_d=R_{d1}+R_{d2}$, and accordingly, $I_d=v_{diso}/R_{d1}$. It should be noted that, the resistor $R_{d2}$ may be omitted in a case that sampled voltage is in an appropriate range, in which case $R_d=R_{d1}$.

Third Embodiment

Referring to the above embodiments, in the technical solution according to the present disclosure, the control module may control each switch transistor in each converting circuit 130 to be switched on or switched off, to define the first conducting state and the second conducting state of the cascaded multilevel converter. It should be noted that, each of the switches in the switch group module 110 is always switched off during a self-test performed by the self-test system.

Figure 5:
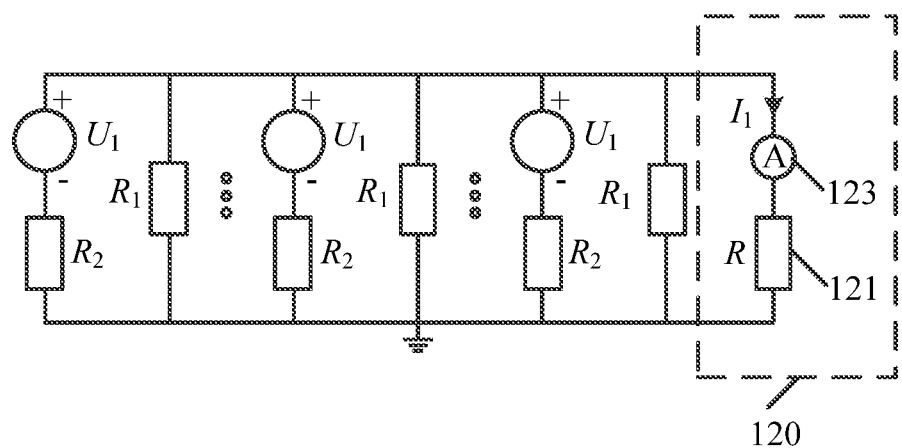
FIG. 5 is an equivalent circuit diagram of a cascaded multilevel converter in a first conducting state according to a third embodiment of the present disclosure.

FIG. 5 shows an equivalent circuit of the cascaded multilevel converter in the first conducting state according to a third embodiment of the present disclosure. Referring to FIG. 3 together, in the first conducting state, a detected current in the cascaded multilevel converter flows from the second output terminal of the first one of the converting circuits 130 into the first output terminal of the second one of the converting circuits 130, and flows through the converting circuits 130 sequentially, and finally flows from the second output terminal of the last one of the converting circuits 130 (in a case that the filtering circuit 140 is provided, the detected current also flows through the filtering circuit 140) into the current detecting circuit 120, and then flows through the current acquiring unit 123 in the current detecting circuit 120. At this point, a first detected current $I_1$ is detected by the current acquiring unit 123.

An arbitrary one of the converting circuits in FIG. 3 is described below as an example. Those skilled in the art can understand that other converting circuits have the same manner of operation. After a detected current is received by the first output terminal of the converting circuit 130, the detected current firstly flows through a second terminal of the first switch transistor 1122. Since both the first switch transistor 1122 and the second switch transistor 1123 are switched on in this case, both paths including the first switch transistor 1122 and the second switch transistor 1123 respectively are conductive. Hence, the detected current is divided into two branches after being outputted from a first terminal of the first switch transistor 1122, with one branch flowing into an equivalent circuit consisting of the direct current source 300 and the equivalent resistors $R_1$ and $R_2$, and the other branch flowing into next one of the converting circuits 130 through the second switch transistor 1123 until flowing from the second output terminal of the last one of the converting circuits 130 (in a case that the filtering circuit 140 is provided, the detected current also flows through the filtering circuit 140) into the current detecting circuit 120. At this point, the first detected current $I_1$ may be detected by the current acquiring unit 123 in the current detecting circuit 120.

It should be noted that, a voltage between the positive electrode and the negative electrode of each direct current source 300 may also be measured by the voltage acquiring module in the first conducting state, which is referred to as a first bus voltage $U_1$, corresponding to $V_{dc1}$ to $V_{dcn}$ in FIG. 3 respectively.

Figure 6:
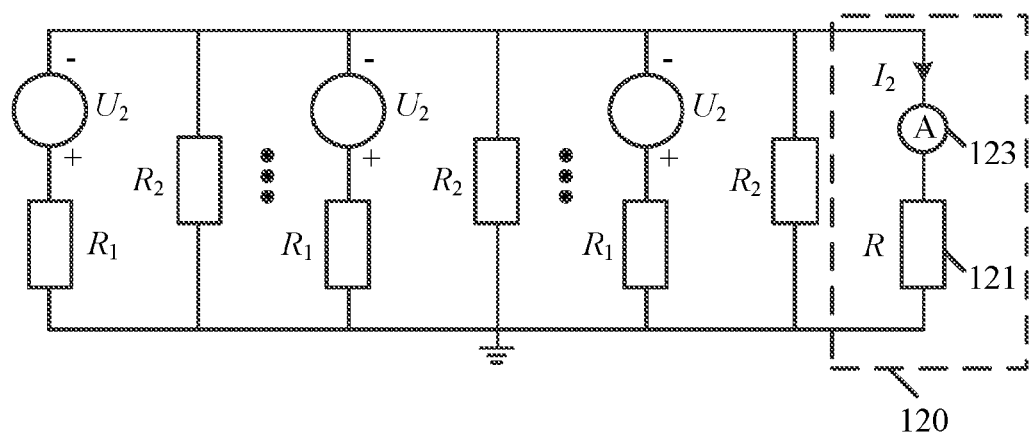
FIG. 6 is an equivalent circuit diagram of a cascaded multilevel converter in a second conducting state according to the third embodiment of the present disclosure.

FIG. 6 shows an equivalent circuit of the cascaded multilevel converter in the second conducting state according to the third embodiment of the present disclosure. Referring to FIG. 3 together, in the second conducting state, a detected current in the cascaded multilevel converter flows from the second output terminal of the first one of the converting circuits 130 into the first output terminal of the second one of the converting circuits 130, and flows through the converting circuits 130 sequentially, and finally flows from the second output terminal of the last one of the converting circuits 130 (in a case that the filtering circuit 140 is provided, the detected current also flows through the filtering circuit 140) into the current detecting circuit 120, and then flows through the current acquiring unit 123 in the current detecting circuit 120. At this point, a second detected current $I_2$ is detected by the current acquiring unit 123.

An arbitrary one of the converting circuits in FIG. 3 is described below as an example. Those skilled in the art can understand that other converting circuits have the same manner of operation. After a detected current is received by the first output terminal of the converting circuit 130, the detected current firstly flows through a first terminal of the fourth switch transistor 1125. Since both the third switch transistor 1124 and the fourth switch transistor 1125 are switched on in this case, both paths including the third switch transistor 1124 and the fourth switch transistor 1125 respectively are conductive. Hence, the detected current is divided into two branches after being outputted from a second terminal of the fourth switch transistor 1122, with one branch flowing into an equivalent circuit consisting of the direct current source 300 and the equivalent resistors $R_1$ and $R_2$, and the other branch flowing into next one of the converting circuits 130 through the third switch transistor 1124 until flowing from the second output terminal of the last one of the converting circuits 130 (in a case that the filtering circuit 140 is provided, the detected current also flows through the filtering circuit 140) into the current detecting circuit 120. At this point, the second detected current $I_2$ is detected by the current acquiring unit 123 in the current detecting circuit 120.

It should be noted that, a voltage between the positive electrode and the negative electrode of each direct current source 300 may also be measured by the voltage acquiring module in the second conducting state, which is referred to as a second bus voltage $U_2$, corresponding to $V_{dc1}$ to $V_{dcn}$ in FIG. 3 respectively.

The first bus voltages $U_1$, the second bus voltages $U_2$, the first detected current $I_1$ and the second detected current $I_2$ are inputted to the calculating module 220 after detected. For the calculating module 220, by assuming all the equivalent resistors $R_1$ have a same resistance value and all the equivalent resistors $R_2$ have a same resistance value, a calculating equation for an equivalent circuit of the cascaded multilevel converter in the first conducting state and a calculating equation for an equivalent circuit of the cascaded multilevel converter in the second conducting state are expressed as:

$$\begin{cases} I_1 = \dfrac{nRI_1}{R_1} + \dfrac{nRI_1 - \sum U_1}{R_2} \\ I_2 = \dfrac{nRI_2}{R_2} + \dfrac{nRI_2 - \sum U_2}{R_1} \end{cases}$$

where n denotes the number of the converting circuits, and R denotes a resistance value of the first resistor 121.

The equivalent resistors $R_1$ and $R_2$ may be obtained in a simplified form as:

$$\begin{cases} R_1 = nR\left(1 - \dfrac{R_y}{R_x}\right) + R_y \\ R_2 = nR\left(1 - \dfrac{R_x}{R_y}\right) - R_x \end{cases}$$

where $R_x$ and $R_y$ are intermediate variables for calculation and may be obtained according to the following equations:

$$\begin{cases} R_x = \dfrac{1}{I_1}\sum U_1 \\ R_y = \dfrac{1}{I_2}\sum U_2 \end{cases}$$

Then the insulation resistance value R' of the cascaded multilevel converter may be obtained as:

$$R' = \frac{R_1 R_2}{n(R_1 + R_2)}$$

After calculating the insulation resistance value R', the calculating module 220 sends the insulation resistance value R' to the comparing module 230. The comparing module 230 compares the insulation resistance value R' with a reference insulation resistance value $R_0$.

The cascaded multilevel converter self-test system according to the embodiment of the present disclosure may be applied to a single-phase grid-connected system or a three-phase system. In a case that the cascaded multilevel converter is not grounded directly, the current detecting circuit needs a zero wire of a gird system to form a loop circuit. An example in which the cascaded multilevel converter self-test system is applied to a single-phase grid-connected system is described below.

Figure 7:
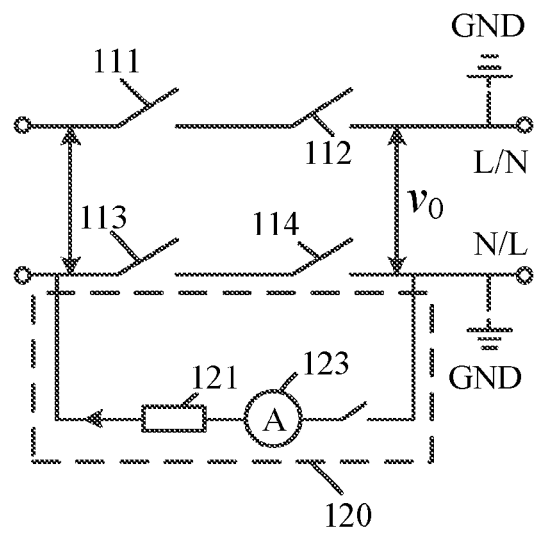
FIG. 7 is a schematic circuit diagram of a first connection manner of a current detecting circuit according to the third embodiment of the present disclosure.
Figure 8:
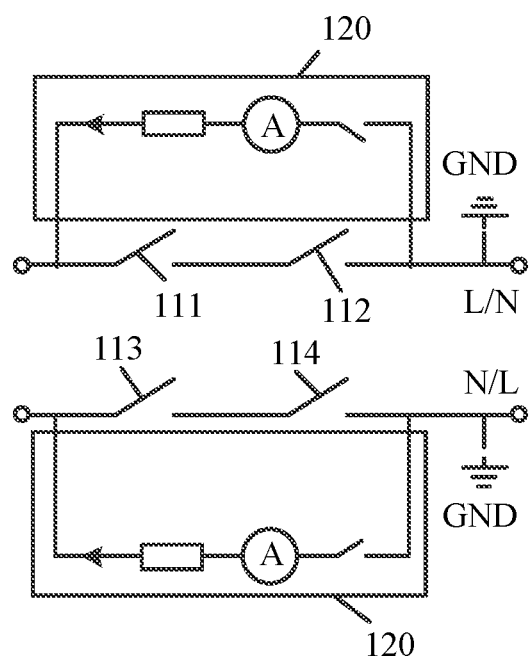
FIG. 8 is a schematic circuit diagram of a second connection manner of a current detecting circuit according to the third embodiment of the present disclosure.

FIG. 7 is a schematic circuit diagram of a first connection manner of a current detecting circuit according to the third embodiment of the present disclosure, and FIG. 8 is a schematic circuit diagram of a second connection manner of a current detecting circuit according to the third embodiment of the present disclosure. The output terminals of the cascaded multilevel converter, i.e., two output terminals of the switch group module are connected to a zero wire N and a fire wire L respectively. Normally, the zero wire N is grounded nearly or remotely, while the fire wire L is not grounded.

In a case that only one current detecting circuit 120 is included as shown in FIG. 7, the current detecting circuit 120 may be connected to a second terminal of the first switch 111 or may be connected to a second terminal of the third switch 113 as shown in FIG. 7. In a current detection, it is required to determine whether the current detecting circuit 120 is connected to the zero wire N or the fire wire L. If it is determined that the current detecting circuit 120 is connected to the fire wire L, it is needed to filter out a component of power-frequency from the detected current. And if it is determined that the current detecting circuit 120 is connected to the zero wire N, the insulation resistance value may be directly calculated based on the detected current without such filtering.

Furthermore, FIG. 8 shows another connection manner of the current detecting circuit. In this manner, two current detecting circuits 120 are provided and are connected to the first terminal of the first switch 111 and the first terminal of the third switch 113 respectively. Hence, it is certain that one of the two current detecting circuits 120 is connected to the zero wire N and the other one of the two current detecting circuits 120 is connected to the fire wire L. In a current detection, it is only determined whether a component of power frequency exists or not in a detected current. If a component of power frequency exists in the detected current detected by one of the two current detecting circuits 120, the other one of the two current detecting circuits 120 is started and the insulation resistance value is calculated based on the detected current detected by the other one of the two current detecting circuits 120.

Each of the above technical solutions may be capable of solving a problem that a current detection value detected by the current detecting circuit is invalid due to an issue of ground wire connection, or capable of detecting an insulation resistance value in a case that the cascaded multilevel converter is not grounded directly. Furthermore, for a three-phase system, the phases may be each connected to a current detecting circuit, or may share a current detecting circuit and be detected in a time-division multiplexing manner. The insulation resistance value of the cascaded multilevel converter may be calculated with the above technical solution after the detected current is detected.

Fourth Embodiment

Figure 9:
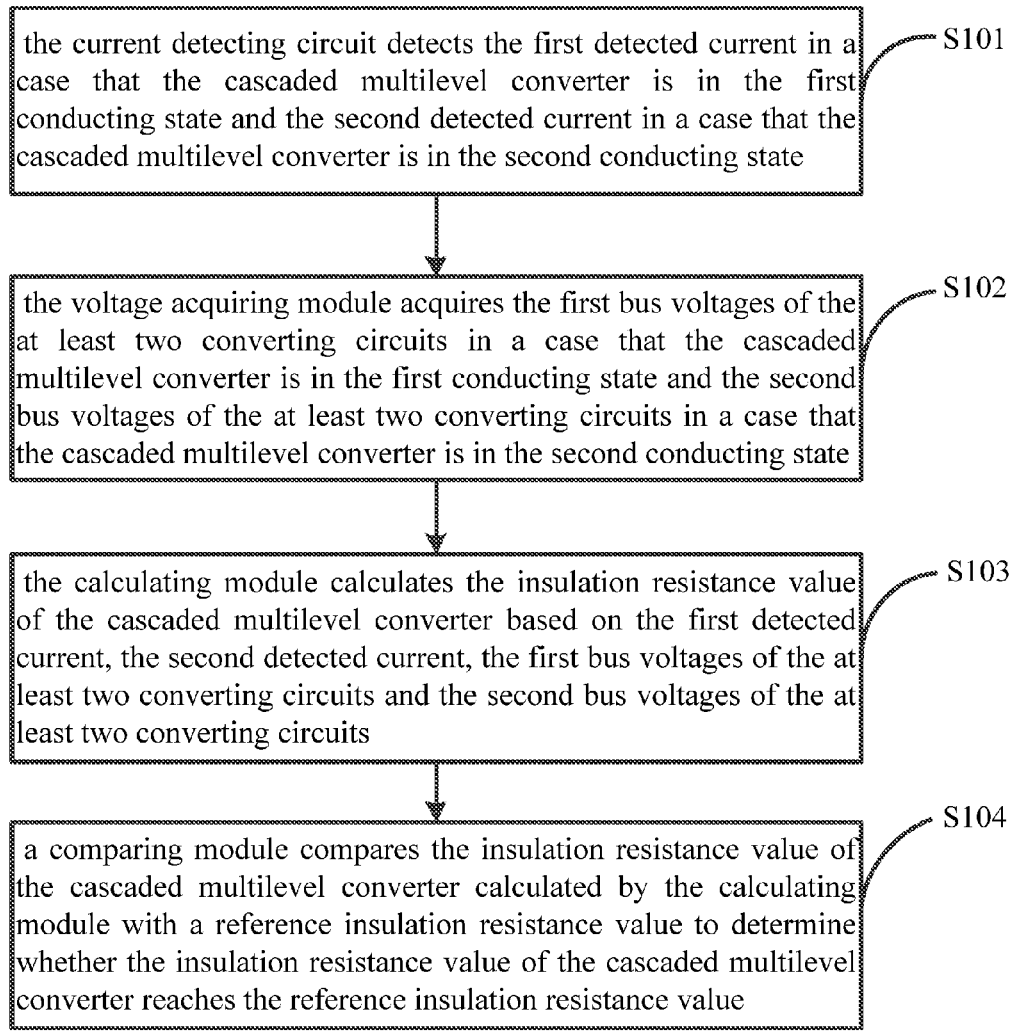
FIG. 9 is a schematic flowchart of a self-test method for a cascaded multilevel converter self-test system according to a fourth embodiment of the present disclosure.

FIG. 9 is a schematic flowchart of a self-test method for a cascaded multilevel converter self-test system according to a fourth embodiment of the present disclosure. The self-test method is adopted to acquire an insulation resistance value of a cascaded multilevel converter based on the self-test system according to the above first, second or third embodiment. As shown in FIG. 9, the self-test method for a cascaded multilevel converter self-test system includes step S101 to step S103.

In step S101, the current detecting circuit detects the first detected current $I_1$ in a case that the cascaded multilevel converter is in the first conducting state and the second detected current $I_2$ in a case that the cascaded multilevel converter is in the second conducting state.

In step S102, the voltage acquiring module acquires the first bus voltages $U_1$ of the at least two converting circuits in a case that the cascaded multilevel converter is in the first conducting state and the second bus voltages $U_2$ of the at least two converting circuits in a case that the cascaded multilevel converter is in the second conducting state.

In step S103, the calculating module calculates the insulation resistance value R' of the cascaded multilevel converter based on the first detected current $I_1$, the second detected current $I_2$, the first bus voltages $U_1$ of the at least two converting circuits and the second bus voltages $U_2$ of the at least two converting circuits.

Furthermore, the self-test method may further include step S104.

In step S104, a comparing module compares the insulation resistance value of the cascaded multilevel converter calculated by the calculating module with a reference insulation resistance value to determine whether the insulation resistance value of the cascaded multilevel converter reaches the reference insulation resistance value.

The above are only preferred embodiments and technical principle of the present disclosure. The present disclosure is not limited to the particular embodiments described herein.

Various changes, adjustments and substitutions that may be made by those skilled in the art fall within the protection scope of the present disclosure. Therefore, although the present disclosure is described in detail through the above embodiments, the present disclosure is not limited to the above embodiments. Other equivalent embodiments may be included in the present disclosure without departing the conception of the present disclosure, and the scope of the present disclosure is defined by the claims.

The invention claimed is:

1. A cascaded multilevel converter self-test system comprising a cascaded multilevel converter and a self-test device, wherein the cascaded multilevel converter comprises at least two converting circuits which are cascaded, and the self-test device comprises at least one current detecting circuit, a voltage acquiring module and a calculating module, and wherein:
the at least two converting circuits each have a first output terminal and a second output terminal and are electrically connected in sequence with the first output terminal and the second output terminal, and each of the at least two converting circuits is provided with and electrically connected to an external direct current source in a one-to-one manner, the direct current source is configured to supply a direct current to the converting circuit corresponding to the direct current source;
a first terminal of the at least one current detecting circuit is electrically connected to the first output terminal of the first one of the at least two converting circuits and/or the second output terminal of the last one of the at least two converting circuits, a second terminal of the at least one current detecting circuit is grounded; the at least one current detecting circuit is configured to detect a first detected current in a case that the cascaded multilevel converter is in a first conducting state and a second detected current in a case that the cascaded multilevel converter is in a second conducting state;
the voltage acquiring module is configured to acquire first bus voltages of the at least two converting circuits in a case that the cascaded multilevel converter is in the first conducting state and second bus voltages of the at least two converting circuits in a case that the cascaded multilevel converter is in the second conducting state; and
the calculating module is configured to calculate an insulation resistance value of the cascaded multilevel converter based on the first detected current, the second detected current, the first bus voltages of the at least two converting circuits and the second bus voltages of the at least two converting circuits.

2. The cascaded multilevel converter self-test system according to claim 1, further comprising:
a comparing module, configured to compare the insulation resistance value of the cascaded multilevel converter calculated by the calculating module with a reference insulation resistance value to determine whether the insulation resistance value of the cascaded multilevel converter reaches the reference insulation resistance value.

3. The cascaded multilevel converter self-test system according to claim 1, wherein each of the at least two converting circuits comprises a first capacitor, a first switch transistor, a second switch transistor, a third switch transistor and a fourth switch transistor;
a first terminal of the first switch transistor is electrically connected to a first terminal of the second switch transistor, a first terminal of the first capacitor and a positive electrode of the direct current source corresponding to the converting circuit, a second terminal of the first switch transistor is electrically connected to a first terminal of the third switch transistor and serves as the first output terminal of the converting circuit, a second terminal of the second switch transistor is electrically connected to a first terminal of the fourth switch transistor and serves as the second output terminal of the converting circuit, and a second terminal of the third switch transistor is electrically connected to a second terminal of the fourth switch transistor, a second terminal of the first capacitor and a negative electrode of the direct current source corresponding to the converting circuit;
the self-test device further comprises a control module configured to control the first switch transistor, the second switch transistor, the third switch transistor and the fourth switch transistor to be switched on or switched off;
the cascaded multilevel converter is in the first conducting state in a case that the first switch transistor and the second switch transistor are switched on and the third switch transistor and the fourth switch transistor are switched off; and
the cascaded multilevel converter is in the second conducting state in a case that the third switch transistor and the fourth switch transistor are switched on and the first switch transistor and the second switch transistor are switched off.

4. The cascaded multilevel converter self-test system according to claim 1, wherein
the cascaded multilevel converter further comprises a filtering circuit and a switch group module; and
a first terminal of the filtering circuit is electrically connected to the first output terminal of the first one of the at least two converting circuits, a second terminal of the filtering circuit is electrically connected to the second output terminal of the last one of the at least two converting circuits, and a third terminal and a fourth terminal of the filtering circuit are electrically connected to the switch group module.

5. The cascaded multilevel converter self-test system according to claim 4, wherein the switch group module comprises a first switch, a second switch, a third switch and a fourth switch;
a second terminal of the first switch is electrically connected to a first terminal of the second switch, and a first terminal of the first switch is electrically connected to the third terminal of the filtering circuit; and
a second terminal of the third switch is electrically connected to a first terminal of the fourth switch, and a first terminal of the third switch is electrically connected to the fourth terminal of the filtering circuit.

6. The cascaded multilevel converter self-test system according to claim 5, wherein each of the first switch, the second switch, the third switch and the fourth switch is a relay.

7. The cascaded multilevel converter self-test system according to claim 1, wherein the current detecting circuit comprises a first resistor, a fifth switch and a current acquiring unit connected in series.

8. The cascaded multilevel converter self-test system according to claim 7, wherein
the first terminal of the current detecting circuit is electrically connected to the first output terminal of the first one of the at least two converting circuits, or the first terminal of the current detecting circuit is electrically connected to the second output terminal of the last one of the at least two converting circuits, or the first terminal of the current detecting circuit is electrically connected to a third terminal or a fourth terminal of a filtering circuit in a case that the cascaded multilevel converter self-test system includes the filtering circuit; and the second terminal of the current detecting circuit is electrically connected to a ground wire.

9. A self-test method for a cascaded multilevel converter self-test system, wherein the cascaded multilevel converter self-test system comprises a cascaded multilevel converter and a self-test device, wherein the cascaded multilevel converter comprises at least two converting circuits which are cascaded, and the self-test device comprises at least one current detecting circuit, a voltage acquiring module and a calculating module, and wherein the at least two converting circuits each have a first output terminal and a second output terminal and are electrically connected in sequence with the first output terminal and the second output terminal, and each of the at least two converting circuits is provided with and electrically connected to an external direct current source in a one-to-one manner, the direct current source is configured to supply a direct current to the converting circuit corresponding to the direct current source;

a first terminal of the at least one current detecting circuit is electrically connected to the first output terminal of the first one of the at least two converting circuits and/or the second output terminal of the last one of the at least two converting circuits, a second terminal of the at least one current detecting circuit is grounded, and wherein the self-test method comprises:

detecting, by the current detecting circuit, the first detected current in a case that the cascaded multilevel converter is in the first conducting state and the second detected current in a case that the cascaded multilevel converter is in the second conducting state;

acquiring, by the voltage acquiring module, the first bus voltages of the at least two converting circuits in a case that the cascaded multilevel converter is in the first conducting state and the second bus voltages of the at least two converting circuits in a case that the cascaded multilevel converter is in the second conducting state; and calculating, by the calculating module, the insulation resistance value of the cascaded multilevel converter based on the first detected current, the second detected current, the first bus voltages of the at least two converting circuits and the second bus voltages of the at least two converting circuits.

10. The self-test method according to claim 9, further comprising:

comparing, by a comparing module, the insulation resistance value of the cascaded multilevel converter calculated by the calculating module with a reference insulation resistance value to determine whether the insulation resistance value of the cascaded multilevel converter reaches the reference insulation resistance value.

* * * * *